(12) United States Patent
Lundberg

(10) Patent No.: US 8,179,178 B2
(45) Date of Patent: May 15, 2012

(54) REGISTERS WITH REDUCED VOLTAGE CLOCKS

(75) Inventor: James R. Lundberg, Austin, TX (US)

(73) Assignee: VIA Technologies, Inc., New Taipei (TW)

(*) Notice: Subject to any disclaimer, the term of this patent is extended or adjusted under 35 U.S.C. 154(b) by 393 days.

(21) Appl. No.: 12/540,762

(22) Filed: Aug. 13, 2009

(65) Prior Publication Data

US 2011/0037508 A1 Feb. 17, 2011

(51) Int. Cl.
*H03K 3/356* (2006.01)
(52) U.S. Cl. ......... 327/208; 327/202; 327/215; 327/333
(58) Field of Classification Search .................. 327/202, 327/203, 208, 210–212, 215, 218, 333; 326/68, 326/80, 81; 365/189.11
See application file for complete search history.

(56) References Cited

U.S. PATENT DOCUMENTS

| 7,138,831 | B2* | 11/2006 | Tobita | 326/81 |
| 7,804,346 | B2* | 9/2010 | Park | 327/208 |
| 7,973,581 | B2* | 7/2011 | Mizuhashi et al. | 327/208 |
| 2008/0290921 | A1* | 11/2008 | Park | 327/333 |

* cited by examiner

*Primary Examiner* — Long Nguyen
(74) *Attorney, Agent, or Firm* — Gary R. Stanford; James W. Huffman

(57) ABSTRACT

A register circuit including a level shift circuit, a latch isolation circuit, and a keeper circuit for registering data with a lower voltage clock signal. The level shift circuit switches a level shift node between a reference voltage level and an upper voltage level in response to a clock node and an input node. The clock node toggles between the reference voltage level and a lower voltage level. The latch isolation circuit isolates an output node from the input node when the clock node is at the reference voltage level, and asserts the output node to one of the reference voltage level and an upper voltage level based on a state of the input node when the clock node is at the lower voltage level. The keeper circuit maintains a state of the output node when the clock node is at the reference voltage level.

20 Claims, 9 Drawing Sheets

REGISTERS WITH REDUCED VOLTAGE CLOCKS

BACKGROUND OF THE INVENTION

1. Field of the Invention

The present invention relates to latch and register circuits, and more particularly to a latch circuit which operates with a reduced voltage clock node.

2. Description of the Related Art

Modern microprocessors have multiple operating modes which include multiple power states. The multiple power states include several low power operating states for reducing overall power consumption. Various methods are known for reducing power, such as various combinations of adjusting operating voltage and/or operating frequency among other operating parameters. As an example, the core operating frequency of a microprocessor may be reduced by a significant factor (e.g., 16), and the core voltage may be reduced by half or more of the full power operating voltage. In certain low power states, the voltages of the clocks are reduced. The same reduced clock voltage is applied across the entire chip to maintain phase alignment and avoid phase errors. The same clock voltage is used across the chip die since a higher voltage clock signal would propagate faster across the chip die and arrive at various logic at different times relative to lower voltage clock signals resulting in undesired clock skew disparities.

There are certain conditions or situations in which higher voltage and/or higher frequency signals are used within a microprocessor even during low power operating states. For example, regardless of the power state of the microprocessor, an external bus (e.g., front-side bus) interfacing the microprocessor with external devices may still be operating at full voltage and/or a different frequency. Depending upon the frequency disparity, there may not be sufficient time to level-shift core data signals to the voltage level at the output using conventional level-shift circuits. As another example, the chip die may include a higher voltage portion or "island" operating at increased voltage levels. It is desired to use the same clock across the chip die even during low voltage conditions. There is a need for latching and registering higher voltage data using lower voltage clocks.

SUMMARY OF THE INVENTION

A register circuit according to one embodiment includes a level shift circuit, a latch isolation circuit, and a keeper circuit for registering data with a lower voltage clock signal. The level shift circuit switches a level shift node between a reference voltage level and an upper voltage level in response to a clock node and an input node. The clock node toggles between the reference voltage level and a lower voltage level, in which the lower voltage level and the upper voltage level are both greater than the reference voltage level, and in which the upper voltage level is greater than the lower voltage level. The latch isolation circuit isolates an output node from the input node when the clock node is at the reference voltage level, and asserts the output node to one of the reference voltage level and the upper voltage level based on a state of the input node when the clock node is at the lower voltage level. The keeper circuit maintains a state of the output node when the clock node is at the reference voltage level.

The level shift circuit and the first latch isolation circuit may be implemented with P-channel and N-channel devices. In one embodiment, the level shift circuit includes a P-channel device having a gate coupled to the clock node, a drain coupled to the level shift node, and a source and bulk coupled to a first source voltage node at the upper voltage level. The level shift circuit further includes an N-channel device having a source coupled to the input node, a bulk coupled to a second source voltage node at the reference voltage level, a drain coupled to the level shift node, and a gate coupled to the clock node. The latch isolation circuit may further include second and third P-channel devices and second and third N-channel devices. The second P-channel device has a gate coupled to the level shift node, a drain, and a source and bulk coupled to the first source voltage node. The third P-channel device has a gate coupled to the input node, a drain coupled to the output node, a source coupled to the drain of the second P-channel device, and a bulk coupled to the first source voltage node. The second N-channel device has a drain coupled to the output node, a bulk coupled to the second source voltage node, a source, and a gate coupled to the clock node. The third N-channel device has a drain coupled to the source of the second N-channel device, a bulk and source coupled to the second source voltage node, and a gate coupled to the input node. The keeper circuit may also be implemented with P-channel and N-channel devices.

A pair of latches may be configured as master-slave latches and inverters in a master-slave register configuration. The master latch may be implemented as a pulse clock circuit which pulses the clock node of the register for registering the data. The data may be lower or higher voltage. The register circuits operate in similar manner to register data even when the voltage of the clock is increased up to the upper voltage level. The register circuit may be implemented on an integrated circuit, such as a microprocessor or the like. The microprocessor may have multiple power states including a reduced power state in which the clock signals are reduced.

A method of registering a state of an input node according to one embodiment includes toggling a clock node between a reference voltage level and a lower voltage level, controlling a level shift circuit to pull a level shift node to the upper voltage level when the clock node is at the reference voltage level, and to pull the level shift node to the reference voltage level when the clock node is at the lower voltage level and the data node is at the reference voltage level, controlling a latch isolation circuit to pull an output node high to the upper voltage level when the level shift node and the input node are both at the reference voltage level, to pull the output node to the reference voltage level when the clock node is at the lower voltage level and when the input node is at least as high as the lower voltage level, and to isolate the output node from the input node when the clock node is at the reference voltage level, and controlling a keeper circuit to maintain the voltage level of the output node when the clock signal is at the lower voltage level.

The method may include turning on a P-channel device coupled between the clock node and the level shift node. The method may include turning on an N-channel device, which is coupled between the input node and the level shift node, when the clock node is at the lower voltage level and the input node is at the reference voltage level. The method may include turning a P-channel device, which is coupled between the clock node and the level shift node, at least partially on to pull the level shift node to the upper voltage level when the clock node is at the lower voltage level and the input node is at least at the lower voltage level.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The present inventor has observed difficulties when attempting to register data using lower voltage clocks using conventional circuitry. The disadvantages include, for example, the inability to guarantee that the proper data state is registered. He has therefore developed a latch with reduced voltage clock, as will be further described below with respect to FIGS. 1-9.

Figure 1:
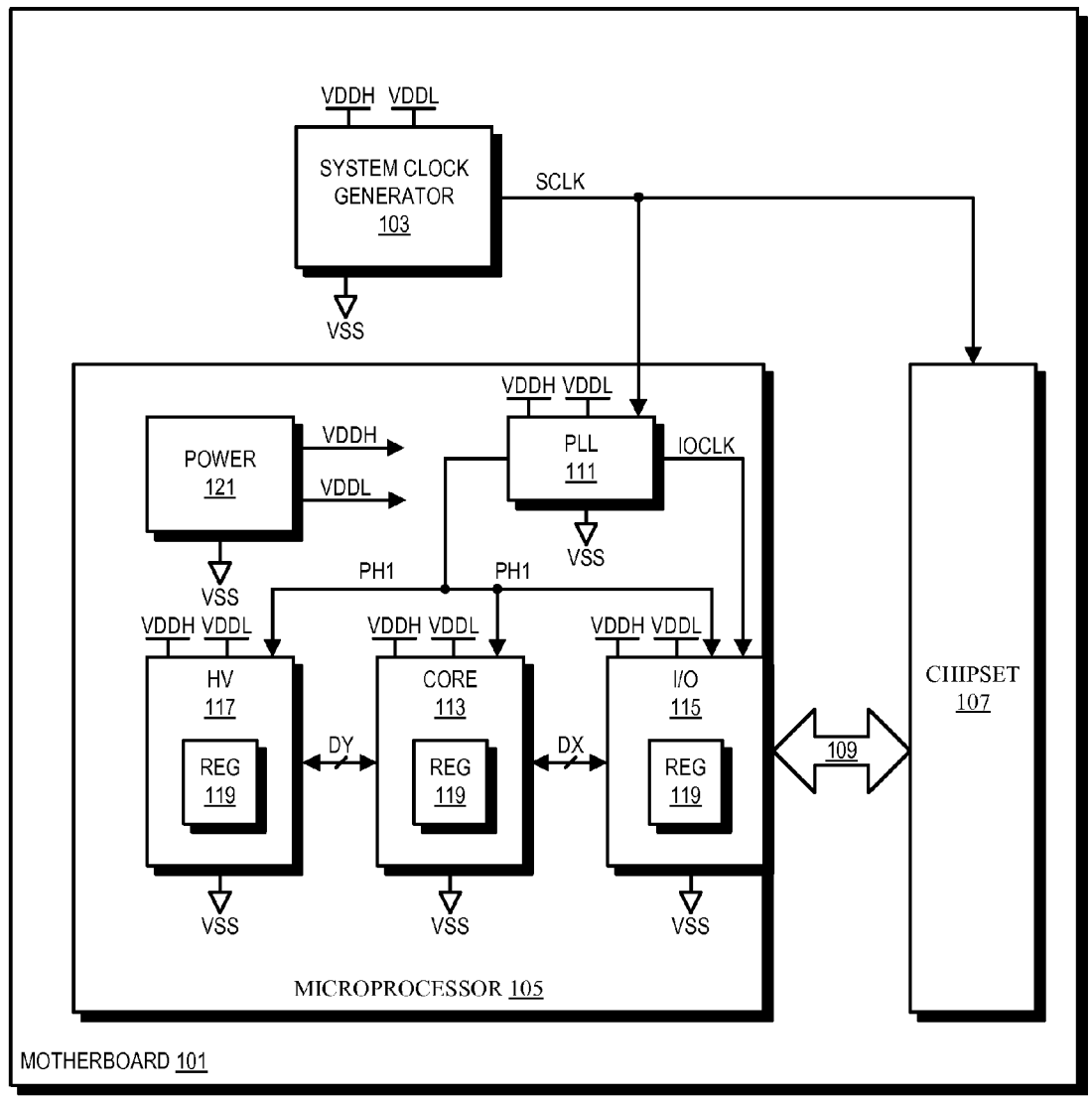
FIG. 1 is a simplified block diagram of a motherboard including a microprocessor with a register circuit implemented according to an exemplary embodiment.

FIG. 1 is a simplified block diagram of a motherboard 101 including a microprocessor 105 with a register circuit 119 implemented according to an exemplary embodiment. The motherboard 101 is configured as a printed circuit board (PCB) or the like for a computer system, although it is understood that the present invention is not limited to computer systems and is applicable to any type of electronic system with voltage and/or frequency disparities. The motherboard 101 includes a system clock generator 103, the microprocessor 105, a chipset 107 and an I/O bus 109 interfacing the chipset 107 with the microprocessor 105. The chipset 107 may include any number of integrated circuits (ICs) incorporating any type of supporting circuitry as understood by those skilled in the art, such as a memory controller hub or the like (e.g., Northbridge). The illustrated microprocessor 105 includes a phased-locked loop (PLL) circuit 111, a core circuit 113, an I/O circuit 115 and a high voltage (HV) circuit 117. The core circuit 113, the I/O circuit 115 and the HV circuit 117 each have a register circuit 119 implemented according to an exemplary embodiment for registering data using lower voltage clocks, in which each register circuit 119 represents any combination of latches and registers used within the corresponding circuit. The system clock generator 103 provides a system clock SCLK to the PLL circuit 111 of the microprocessor 105 and to the chipset 107. The PLL circuit 111 generates several clocks within the microprocessor, including, for example, a core clock PH1 provided to the core circuit 113, the I/O circuit 115 and the HV circuit 117, and an I/O clock IOCLK provided to the I/O circuit 115. The IOCLK is used by the I/O circuit 115 for transferring data between the microprocessor 101 and the I/O bus 109. The frequency of IOCLK is selected based on desired operation of the I/O bus 109, and may vary significantly from the frequency of PH1 for various operating modes of the microprocessor 105.

In the simplified illustration, multiple data signals DX are transferred between the core circuit 113 and the I/O circuit 115, in which any one or more of the data signals may ultimately be asserted on the I/O bus 109. Also, multiple data signals DY are transferred between the core circuit 113 and the HV circuit 117. Each register circuit 119 uses a corresponding clock signal for latching or registering data, such as either one of the clocks IOCLK and PH1. Although the IOCLK and PH1 clocks are shown distributed across the microprocessor 105 along singular signal lines in the simplified illustration, it is understood by those skilled in the art that clock distribution networks (not shown) are used to distribute each clock from the PLL circuit 111 to corresponding clock nodes at the various distributed locations. Such clock distribution networks are used on the microprocessor 105 to distribute the IOCLK and the PH1 clocks among other various clocks. Each of the microprocessor clocks, including IOCLK and PH1, operate at approximately the same voltage level across the microprocessor chip. In a full power mode or operating state, the voltage of each clock operates at a predetermined maximum voltage level VMAX. When operating in at least one reduced power state, the voltage of each clock operates less than VMAX, down to a predetermined minimum voltage level VMIN.

The microprocessor 105 also includes a power circuit 121 which controls various source voltage levels which are provided throughout the chip die distributed using conductors or conductive traces or the like, such as conductive vias, conductive nodes, conductive rails, conductive buses or bus signals and the like as known to those skilled in the art. The power circuit 121 develops an upper source voltage level VDDH and a lower source voltage level VDDL relative to a ground or reference source voltage level VSS. VDDH, VDDL and VSS are distributed throughout the chip die to the circuitry integrated on the microprocessor 105, including the PLL circuit 111, the core circuit 113, the I/O circuit 115, the HV circuit 117, and the register circuit 119. In one embodiment, VDDH and VDDL both operate within corresponding voltage ranges up to the maximum voltage level VMAX. During certain reduced power states, VDDL is decreased by a suitable amount depending upon the power state. VDDL may be decreased down to VMIN, so that it has a voltage range VMIN-VMAX. VDDH may be reduced somewhat, such as down to an intermediate voltage level VMID, but generally is not reduced to VMIN. The clocks of the microprocessor 105, including PH1 and IOCLK, operate at the level of VDDL. The data of the microprocessor 105, including DX and DY, switch between VSS and either one of VDDL and VDDH. Certain data, denoted "DH", operate relative to the upper source voltage VDDH (and thus switch between VSS and VDDH), whereas other data, denoted "DL", operate relative to the lower source voltage VDDL (and thus switch between VSS and VDDL). In a more specific embodiment, VMAX is approximately 1.2 Volts (V), VMIN is approximately 0.6V, and VMID is approximately 1.05V. Thus, VDDH ranges between 1.05V-1.2V, whereas VDDL ranges between 0.6V-1.2V. During reduced power states, VDDL is generally reduced to a lower voltage than VDDH.

The SCLK operates at a suitable or nominal frequency level FNOM for the motherboard 101 and the components mounted thereon, including the microprocessor 105 and the chipset 107. The PLL circuit 111 includes multiple PLLs (not shown) which multiply the frequency of SCLK by corresponding multiples to achieve the desired frequency of operation. During full power mode, the PLL circuit 111 asserts the core clock PH1 at a maximum frequency level FMAX to achieve maximum performance. In order to reduce power and conserve energy, the PLL circuit 111 reduces the frequency of PH1, such as by reducing the corresponding frequency multiple or the like. In one reduced power state, the PLL circuit 111 asserts the core clock PH1 at a minimum frequency level FMIN to achieve maximum power savings. The PLL circuit 111 generally asserts IOCLK at a suitable frequency level for the I/O bus 109 to maintain timing parameters of the I/O bus 109 and to sustain communications between the microprocessor 105 and the chipset 107. As an example, FMAX may be associated with a frequency multiple of 16× to achieve an operating frequency of FMAX=16×FNOM for maximum performance, and FMIN may be associated with a frequency multiple of 4× to achieve an operating frequency of FMIN=4×FNOM to reduce power consumption. The IOCLK may be associated with a frequency multiple of 8× regardless of the operating mode of the microprocessor 105. In this manner, during certain low power states the when PH1 is operating at FMIN, the core clock PH1 is operating at reduced speed relative to the I/O circuit 115 operating with IOCLK.

Figure 2:
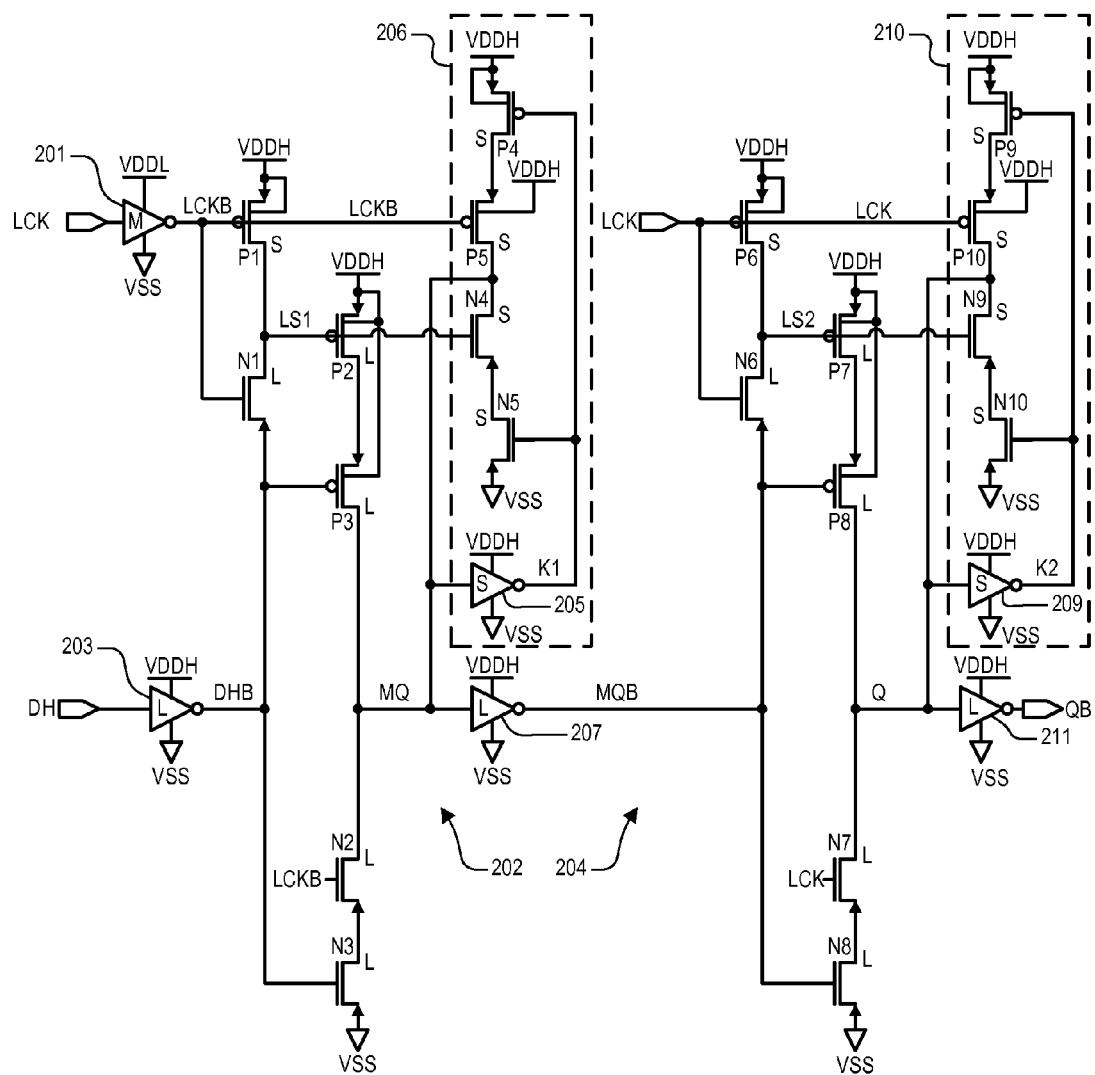
FIG. 2 is a schematic diagram of a register circuit implemented according to an exemplary embodiment of one or more of the register circuits of FIG. 1 for registering an upper voltage data input using a lower voltage clock.

FIG. 2 is a schematic diagram of a register circuit 200 implemented according to an exemplary embodiment of one or more of the register circuits 119 of FIG. 1 for registering an upper voltage data input DH of the microprocessor 105 using a lower voltage clock LCK. LCK is a "lower" voltage clock which represents either PH1 or IOCLK or any other clock on the microprocessor 105 which operates based on VDDL. It is noted that although LCK may be at VMAX during a full power operating mode of the microprocessor 105, LCK may also be reduced down to VMIN during at least one reduced power state. DH represents any upper voltage data on the microprocessor 105, such as any of the DX or DY data or other data switched between VSS and the upper source voltage VDDH. DH is sourced by any higher voltage source device on the microprocessor 105. The core clock LCK switches between VSS and the lower source voltage VDDL. The register circuit 200 includes a pair of latches 202 and 204 configured in a master-slave configuration for registering the input data signal DH as output data QB, in which the latch 202 operates as a master latch and the latch 204 operates as a slave latch. The clock LCK controls the latching action as further described herein.

LCK is provided to the input of an inverter 201, having an output providing an inverted clock LCKB. A "B" appended to a name generally denotes an inverted value unless otherwise specified (e.g., LCKB is an inverted version of LCK). The inverter 201 is "sourced" between VDDL and VSS meaning that it is coupled between source voltages VDDL and VSS. The inverter 201 provides LCKB as a lower voltage clock which switches between VSS and VDDL. Although not explicitly shown, the inverter 201 is implemented as a complementary pair of N- and P-channel devices having their gates coupled together at the input (receiving LCK) and their drains coupled together at the output (providing LCKB). The source and bulk of the P-channel device is coupled to VDDL and the source and bulk of the N-channel device is coupled to VSS. Although not explicitly shown, the bulk of each N-channel device described herein is coupled to VSS unless otherwise specified. Also, the bulk of each P-channel device is coupled to VDDL or VDDH. Most of the P-channel devices have their bulk coupled to VDDH whereas the bulk of some P-channel devices, such as the P-channel device within the inverter 201, is coupled to VDDL.

LCKB is provided to the gates of P-channel devices P1 and P5, and to the gates of N-channel devices N1 and N2. The source and bulk of P1 are coupled to VDDH and its drain is coupled to the drain of N1 at a node LS1 developing a first level shift signal LS1. A node and the signal it carries are generally denoted by the same name unless otherwise specified (e.g., node LS1 carries signal LS1). LS1 is coupled to the gate of a P-channel device P2 and to the gate of an N-channel device N4. The source and bulk of P2 are coupled to VDDH and its drain is coupled to the source of a P-channel device P3. The bulk of P3 is coupled to VDDH and its gate coupled to the source of N1. DH is provided to the input of an inverter 203, which has an output coupled to an input node DHB providing inverted data DHB. The inverter 203 is sourced between the VDDH and VSS so that DHB switches within the larger voltage range between VSS and VDDH. DHB is coupled to the source of N1, to the gate of P3, and to the gate of an N-channel device N3. The drains of P3 and N2 are coupled together at a node MQ developing a signal MQ, which is provided to the inputs of two inverters 205 and 207 and to the drains of N4 and P5 which are coupled together. The drain of N3 is coupled to the source of N2 and the source of N3 is coupled to VSS. A P-channel device P4 has its source and bulk coupled to VDDH and its drain coupled to the source of P5, which also has its bulk coupled to VDDH. An N-channel device N5 has its drain coupled to the source of N4 and its source coupled to VSS. The inverter 205 is sourced between VDDH and VSS and has its output coupled to a first keeper node K1 developing signal K1 which is provided via node K1 to the gates of N5 and P4. The inverter 207 is sourced between VDDH and VSS and has an output MQB coupled to an input of the latch 204. The devices P4, P5, N4 and N5 of the latch 202 are in a stacked configuration between VDDH and VSS forming a keeper circuit 206 for keeping the state of MQ as further described below. The inverters 203, 205 and 207 may be configured in substantially the same manner as the inverter 201, except that the source and bulk of the P-channel device of the higher voltage inverters 203, 205 and 207 are coupled to VDDH rather than VDDL.

The latch 204 includes P-channel devices P6-P10, N-channel devices N6-N10 and inverters 209 and 211, which are configured and coupled together in substantially identical manner as the P-channel devices P1-P5, N-channel devices N1-N5, and inverters 205 and 207, respectively, of the latch 202. For the latch 204, the LCK clock is provided to the gates of P6, P10, N6 and N7 and the MQB node is coupled to the gates of N8 and P8 and to the source of N6. The drains of N6 and P6 are coupled together at a node LS2 developing a second level shift signal LS2, which is provided to the gates of P7 and N9. The drains of P8 and N7 are coupled together at a node Q developing a signal Q, which is provided to the inputs of inverters 209 and 211 and to the drains of P10 and N9 which are coupled together. The inverters 209 and 211 are sourced between VDDH and VSS in a similar manner as the inverters 205 and 207. The output of the inverter 209 is coupled to a second keeper node K2 developing signal K2 which is provided via node K2 to the gates of N10 and P9. The output of the inverter 211 provides the output QB of the register circuit 200. The devices P9, P10, N9 and N10 of the latch 204 are coupled in a stacked configuration between VDDH and VSS forming another keeper circuit 210 for keeping the state of Q.

Devices labeled in the Figures with an "S" denote smaller and weaker devices, whereas devices labeled with an "L" denote relatively larger and stronger devices. Devices labeled with an "M" denote medium or intermediate size and strength. The devices in the data path of the register circuit 200, including the inverters 203, 207, 211, along with the P-channel devices P2, P3, P7 and P8 and the N-channel devices N2, N3, N7 and N8 are implemented as large devices for driving the DHB, MQ, MQB, Q and QB nodes. As further described below, the P2 and P3 devices strongly pull MQ to VDDH when both are turned on, and the N2 and N3 devices strongly pull MQ to VSS when both are turned on. Similarly, the P7 and P8 devices strongly pull Q to VDDH when both are turned on, and the N7 and N8 devices strongly pull Q to VSS when both are turned on. The keeper circuits 206 and 210 are both implemented with relatively weak devices since their function is generally to keep the state of a node rather than to switch the node to a different state. The inverter 201 is labeled with an M denoting that the P- and N-channel devices implementing the inverter 201 are medium-sized devices for driving the node developing the output clock LCKB with intermediate strength. P1 and P6 are small devices for driving LS1 and LS2, respectively. N1 and N6 are relatively large devices which, when turned on, cause LS1 and LS2 to be driven by the outputs of the strong inverters 203 and 207, respectively.

The operation of each of the latches 202 and 204 is now generally described. Each of the latches 202 and 204 are configured in substantially the same manner in which each has an input node (DHB/MQB), a level shift node (LS1/LS2), a keeper node (K1, K2), an output node (MQ/Q), a clock node (LCKB/LCK), a level shift circuit (P1 & N1/P6 & N6), a latch isolation circuit (P2-P3 & N2-N3/P7-P8 & N7-N8), and a keeper circuit (206/210). The latch isolation circuit includes a pull-up circuit (P2-P3, P7-P8) and a pull-down circuit (N2-N3/N7-N8). Additional inverters (201, 203, 207, 211) are used for buffering and/or for inverting the clocks for configuring master and slave latching operation. Each latch has an isolation state when the clock node is low and a transparency state when the clock node is high. The inverter 201 reverses the input clock state for master-slave operation such that one latch is in its isolation state while the other is in its transparency state and vice-versa. The level shift circuit controls the level shift node to switch within the upper voltage range VSS-VDDH based on that state of the clock node and the input node. This is true even when the clock node toggles within the lower voltage range VSS-VDDL and regardless whether the input node is within the lower or upper voltage range. The level shift circuit and latch isolation circuit isolate the input node from the output node when the latch is in the isolation state and drives the output node based on the state of the input node when the latch is in the transparency state. The keeper circuit maintains the state of the output when the latch is in the isolation state.

When the clock node of a given latch is low for the isolation state, the input node is isolated from the output node and the keeper circuit is effectively enabled to keep the output state. For example, when LCKB is low, P1 and N1 are turned fully on. N1 isolates the input node DHB from the level shift node LS1 and P1 pulls LS1 to the upper voltage level VDDH which turns P2 fully off and turns N4 fully on. Also, N2 is turned fully off so that the MQ node is isolated from DHB. If MQ is low, then the inverter 205 pulls K1 high turning on N5 so that the keeper circuit 206 keeps MQ low via N4 and N4. Also, P4 is turned off so that MQ is not pulled high. If MQ is high, then the inverter 205 pulls K1 low turning off N5 and turning on P4 so that the keeper circuit 206 keeps MQ high via P4 and P5. Also, N5 is turned fully off so that MQ is not pulled low.

When the clock node of the given latch goes high for the transparency state, operation of the level shift circuit depends on the state of the input node. If the input node is high when the clock node goes high, then the output node is pulled low by the latch isolation circuit and the level shift node is pulled high to VDDH. If the input node is low when the clock node goes high, then the level shift node is pulled low and the latch isolation circuit pulls the output node high. In either case, when the clock node goes back high to re-instate the isolation state, the input node is once again isolated and the keeper circuit maintains the output state.

As an example, if DHB is high when LCKB goes high, then N1 is turned off and P1 remains at least partially on to pull LS1 to VDDH. The voltage of the source of N1 is equal to or greater than the voltage at its gate keeping it off even if DHB is lower voltage data (e.g., DLB, FIG. 4). The lower VDDL is, the lower the high state of LCKB and the more P1 is turned on to pull LS1 high. DHB turns N3 fully off pulling the source of N2 low, so that N2 is also turned fully off even if LCKB is at VMIN. MQ is pulled low via N2 and N3. In this case, if MQ were previously high so that K1 was low turning on P4, and if LCKB is relatively low so that P5 is at least partially turned on, then N2 and N3 overcome P4 and P5. P4 and P5 are relatively small and thus weak devices whereas N2 and N3 are relatively large and thus strong devices to overcome P4 and P5. Thus, MQ is pulled low and K1 goes high turning off P4 and turning on N5. If LS1 is high, then N4 is also fully turned on so that the keeper circuit 206 already operates to pull MQ low even before the clock node goes back low. If the microprocessor 105 is in a full power state such that VDDL is relatively high even up to VMAX, then N1 and P1 are both turned fully off such that LS1 is in an indeterminate state while LCKB is high (up to VDDH). This condition is inconsequential. Since DHB is high, P3 is off so that even if P2 were fully on it has no effect on the output node. P5 is fully off (when VDDL is a higher voltage) so that the keeper circuit 206 does not counteract the operation of N2 and N3. Also, MQ is pulled low even if N2 is off, and the more N2 is turned on, the more it tends to pull MQ low to the proper state.

Alternatively, if DHB is low when LCKB goes high, then the source of N1 is low and it turns on. In this case, DHB, which is driven by the output of the inverter 203, pulls LS1 low so that P2 is turned fully on and N4 is turned fully off. P3 is also turned fully on while N3 is turned fully off, so that MQ is pulled high to VDDH. N4 is off so that the keeper circuit 206 does not counteract the operation of P2 and P3. In this case the keeper circuit 206 is either turned off or otherwise tends to pull the output node to the proper state.

Figure 3:
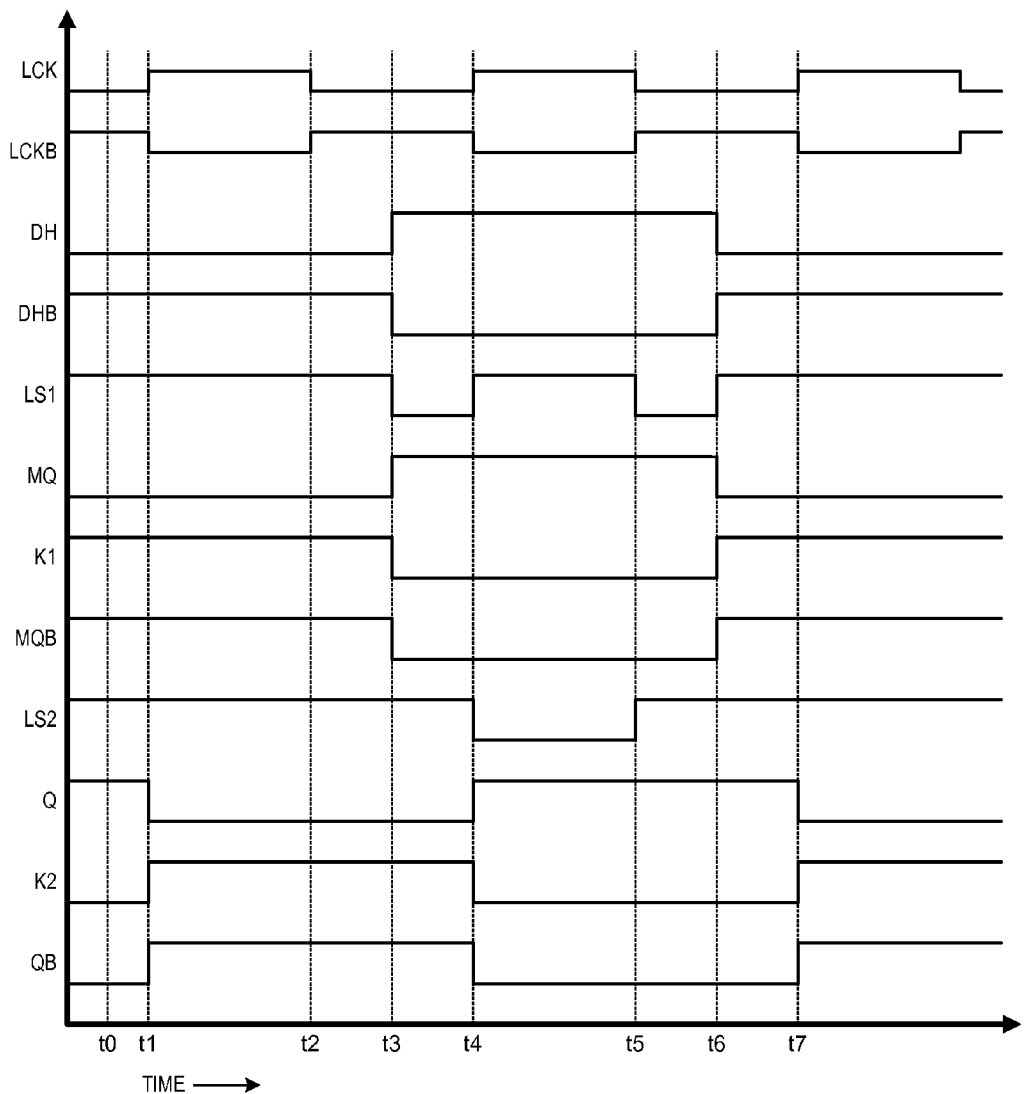
FIG. 3 is a timing diagram illustrating operation of the register circuit of FIG. 2.

FIG. 3 is a timing diagram illustrating operation of the register circuit 200. The nodes LCK, LCKB, DH, DHB, LS1, MQ, K1, MQB, LS2, Q, K2 and QB are plotted versus time. The timing diagrams illustrated herein are simplified. For example, delays through each of the devices are negligible and are not shown. Also, although the timing diagrams show each node as having a certain state, in an actual configuration certain nodes may be unknown or have indeterminate states at certain times. For example, the input data nodes DH and DL (FIG. 5) are shown as having certain states in the timing diagrams, although it is understood that they may have temporary unknown states during signal transitions. In any event, the input data nodes DH and DL are switched to meet the appropriate setup and hold times for each register being illustrated.

The LCK and LCKB nodes are switched within a lower voltage range between VSS and VDDL, whereas the remaining nodes are switched within a higher voltage range between VSS and VDDH. Of course, if VDDL is increased to VDDH then the voltage ranges are about the same. As shown in the timing diagram of FIG. 3, the nodes LCK and LCKB are shown with reduced magnitudes when asserted high. At an initial time t0, the LCK is initially low while LCKB is initially high so that latch 202 is in its transparency state while latch 204 is in its isolation state. The DH input is initially low so that DHB is initially high. Also, Q is initially shown high at time t0, so that K2 and QB are initially low. Since the voltage at the source of N1 is at VDDH, N1 is off. P1 is at least partially on so that LS1 is pulled high to VDDH. LCKB and DHB turn on both of the devices N2 and N3 so that MQ is initially pulled low. K1 is high which turns P4 off and N5 on. Since LS1 is high, N4 is also turned on, so that the keeper circuit 206 also pulls pulling MQ low to VSS. The inverter 207 pulls MQB high opposite the state of MQ.

Since LCK is initially low, N6 and N7 are both initially turned off and P6 is initially turned on. P6 pulls LS2 high so that P7 is initially turned off. In this manner, Q is isolated from MQB while LCK is low and is maintained by the keeper circuit 210. Since Q is shown initially high, the inverter 209 drives K2 low turning N10 off and P9 on. LCK turns P10 on so that Q is maintained high by the keeper circuit 210 via P9 and P10. QB is driven low by the inverter 211 to the opposite state of Q. It is noted that if instead Q were initially low, then K2 would be high turning off P9 and turning on N10. Since LS2 is high, N9 is also turned on so that Q would be pulled low via N9 and N10. In this manner, the keeper circuit 210 initially maintains the state of Q.

At subsequent time t1, LCK goes high and LCKB goes low so that latch 202 transitions to its isolation state whereas latch 204 transitions to its transparency state. N1 and N2 are turned off and P1 is turned on which keeps LS1 high and P2 off. Thus, MQ is effectively isolated from any changes of DH while LCKB is low. Since LS1 and K1 are both high, the keeper circuit 206 keeps MQ low via N4 and N5 so that MQB remains high. LCK going high only partially turns off P6 while N6 remains off so that LS2 remains high. LCK and MQB are both high so that N7 and N8 are both turned on pulling Q low. The inverter 209 pulls K2 high and the inverter 211 pulls QB high. At subsequent time t2, LCK goes low and LCKB goes high so that latch 202 transitions to its transparency state whereas latch 204 transitions to its isolation state. Since DHB remains at the same state, the latch 202 does not change state. The state of latch 204 also remains unchanged.

At subsequent time t3, DH goes high so that DHB is pulled low while latch 202 is still in its transparency state and latch 204 is in its isolation state. N1 turns on and overcomes device P1 so that LS1 is pulled low to turn P2 on and N4 off. Since LS1 and DHB are both low and N3 is turned off, P2 and P3 are turned on pulling MQ high. K1 and MQB are both pulled low at time t3. Latch 204 is in isolation so that the change of sate of MQB does not immediately change the state of latch 204.

At subsequent time t4, LCK goes high and LCKB goes low so that latch 202 transitions to its isolation state and latch 204 transitions to its transparency state. P1 is turned on and N1 is off so that LS1 is pulled back high. P5 is turned fully on and since P4 is already turned on by K1, the keeper circuit 206 maintains the state of MQ. Since MQB is low when LCK is high, N6 turns on pulling LS2 low at time t4. P7 and P8 are turned on while N8 is off so that Q is pulled high and K2 and QB go low. At subsequent time t5, LCK goes back low and LCKB goes high. Since DHB is low, N1 turns on and pulls LS1 low. MQ remains high so that K1 and MQB remain low. LCK going low turns P6 on and N6 is off so that LS2 is pulled back high at time t5. Latch 204 is in isolation so that Q does not change state.

At subsequent time t6 while LCK is low, DH goes low and DHB goes high. N1 turns off and P1 pulls LS1 back high. DHB turns on N3 so that N2 turns on pulling MQ low. K1 and MQB go high. Since LS1 and K1 are both high, the keeper circuit 206 already pulls MQ low even though the latch 202 is in its transparency state. LCK is low so that latch 204 is in isolation and does not change state. At subsequent time t7, LCK goes high and LCKB goes low. P1 is turned on and N1 is off and LS1 remains high while K1 is high so that the keeper circuit 206 maintains the state of MQB. N8 is on so that N7 is turned on while P8 is off and Q is pulled low via N7 and N8. K2 and QB are pulled high by the inverters 209 and 211, respectively, as previously described.

Figure 4:
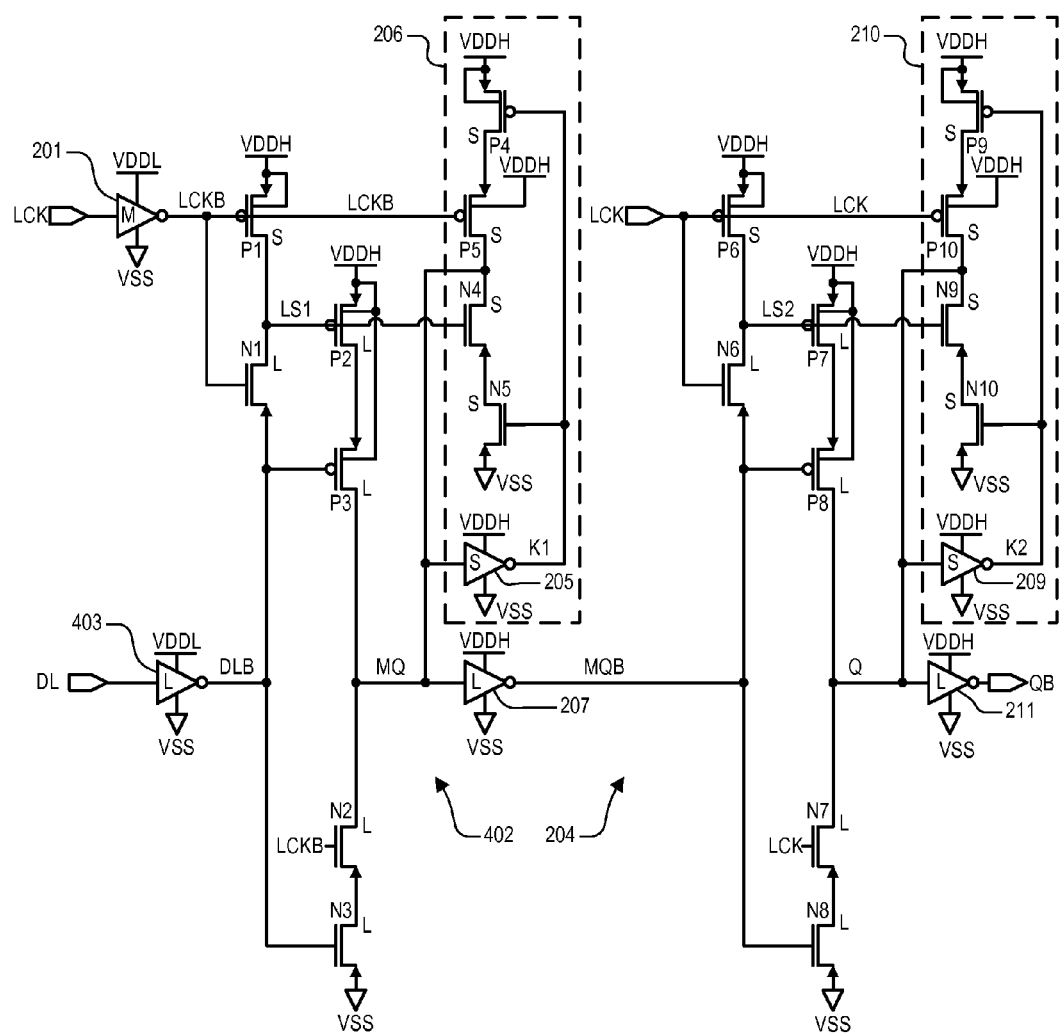
FIG. 4 is a schematic diagram of a register circuit implemented according to an exemplary embodiment of one or more of the register circuits of FIG. 1 for registering a lower voltage data input using a lower voltage clock.

FIG. 4 is a schematic diagram of a register circuit 400 implemented according to an exemplary embodiment of one or more of the register circuits 119 of FIG. 1 for registering a lower voltage data input DL of the microprocessor 105 using the LCK clock. In this case, node DL is switched in the lower voltage range between VSS and VDDL. LCK and LCKB switch between VSS and VDDL in the same manner previously described. The register circuit 400 is substantially identical with the register circuit 200 in which similar devices have identical reference numbers. The master latch 202 is replaced with a master latch 402 and the slave latch 204 is included and operates in the same manner. The master latch 402 is substantially identical with the master latch 202, except that the input inverter 203 is replaced with a lower voltage inverter 403. The inverter 403 receives DL, is sourced between VDDL and VSS, and outputs DLB which switches within the lower voltage range between VSS and VDDL. The inverter 403 is implemented with relatively large P- and N-channel devices but is otherwise configured in substantially the same manner as the inverter 201.

The primary difference between register circuit 400 and register circuit 200 is that DLB is lower voltage (assuming VDDL is lower than VDDH). If DLB is low when LCKB goes high, operation is the same as that described for the register circuit 200. If DLB is high when LCKB goes high, N1 remains off since its gate and source are at the same voltage and operation of LS1 is not changed. As previously described, the lower VDDL is, the more P1 turns on pulling LS1 high to VDDH. For sufficiently low voltage VDDL, LS1 is pulled high to VDDH so that P2 is turned fully on. Although DLB is a lower voltage so that P3 may not be turned fully off, this is inconsequential since P2 is off. N2 and N3 are turned on sufficiently to drive MQ low. When K1 goes high, N5 is turned on so that the keeper circuit 206 reinforces the low state of MQ. As noted, if VDDL is at or near VDDH or VMAX, then LS1 may have an indeterminate state. This is inconsequential since DLB is also higher voltage so that P3 is turned off so that the possible indeterminate state of P2 is inconsequential. For higher voltage VDDL, N2 and N3 are turned more fully on to drive MQ low to VSS. In this manner, the register circuit 400 operates in substantially the same manner as the register circuit 200 when the input is lower voltage.

Figure 5:
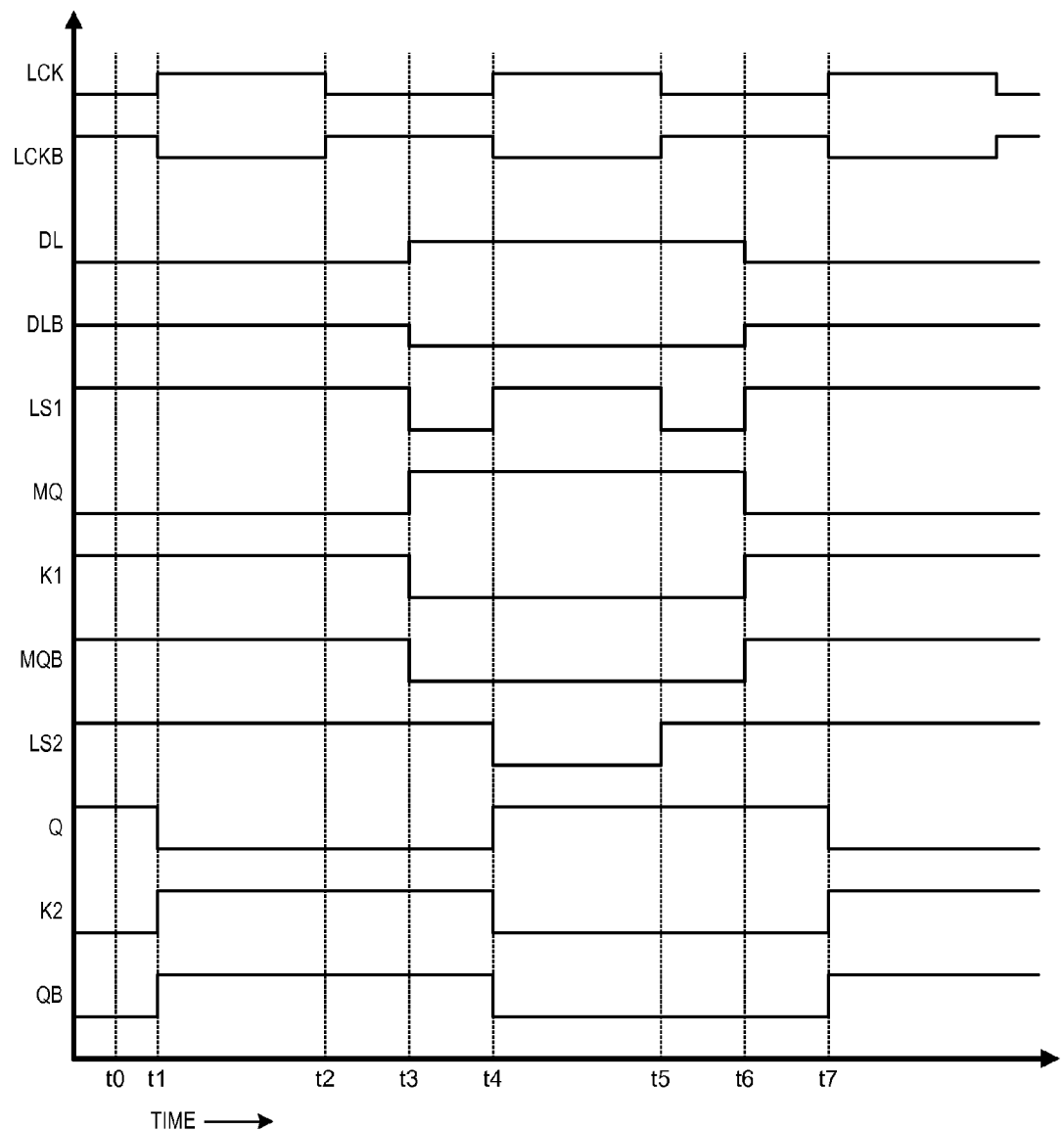
FIG. 5 is a timing diagram illustrating operation of the register circuit of FIG. 4.

FIG. 5 is a timing diagram illustrating operation of the register circuit 400. The nodes LCK, LCKB, DL, DLB, L1, MQ, K1, MQB, LS2, Q, K2 and QB are plotted versus time. As before, delays through each of the devices are negligible and not shown and indeterminate input data states are not shown. Operation of the register circuit 400 is substantially identical with operation of the register circuit 200, so that the timing diagram of FIG. 5 is the same as the timing diagram of FIG. 3 except that the DH and DHB nodes are replaced with lower voltage nodes DL and DLB.

Figure 6:
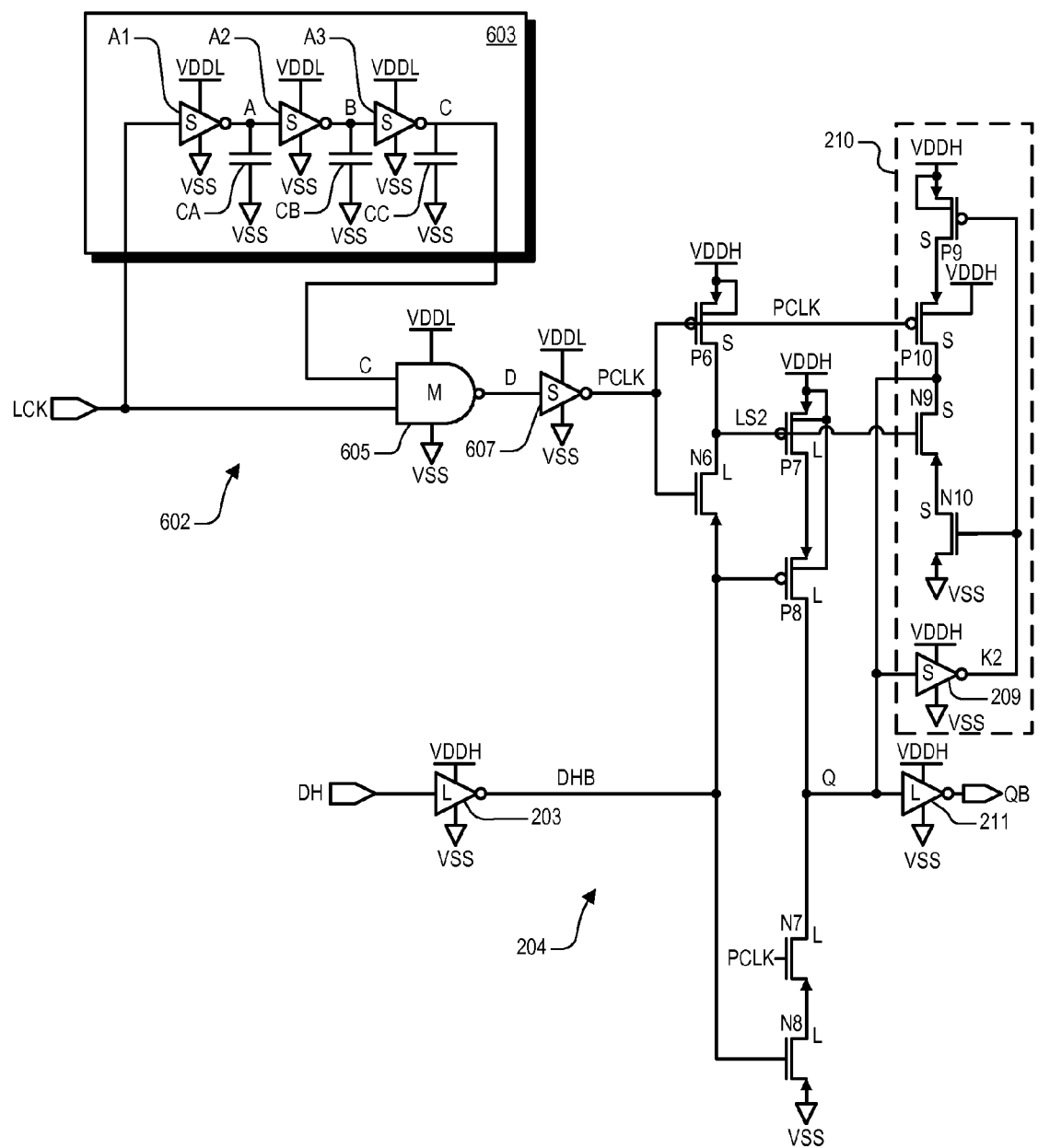
FIG. 6 is a schematic diagram of a pulsed-clock register circuit implemented according to an exemplary embodiment of one or more of the register circuits of FIG. 1 for registering upper voltage data using a lower voltage clock.

FIG. 6 is a schematic diagram of a pulsed-clock register circuit 600 implemented according to an exemplary embodiment of one or more of the register circuits 119 of FIG. 1 for registering upper voltage data DH using the LCK clock. The register circuit 600 is similar to the register circuit 200 in which similar devices have identical reference numbers. The master latch 202 is replaced with a clock pulse circuit 602 which converts the LCK input clock into a pulsed clock PCLK on clock node PCLK. DH is coupled to the inverter 203, which outputs the DHB signal on node DHB in a similar manner as previously described. The slave latch 204 is included, except that it is controlled by PCLK and DHB rather than LCK and MQB. Operation of the slave latch 204 is substantially the same.

The LCK node is coupled to one input of a two-input NAND gate and to the input of a delay circuit 603. The delay circuit 603 outputs a signal C on node C, which is a delayed and inverted version of the LCK node. The output of the NAND gate 605 is coupled to a node D developing a signal D, which is coupled to the input of an inverter 607. The inverter 607 drives the PCLK node with the PCLK signal. The delay circuit 603, the NAND gate 605 and the inverter 607 are all sourced between VDDL and VSS so that the C, D and PCLK nodes are switched within the lower voltage range VSS-VDDL. The delay circuit 603 is implemented with small devices, the NAND gate 605 is implemented with medium-sized devices, and the inverter 607 is implemented with small devices. In operation, when LCK is low and C is high, D is high and PCLK is low. C is a delayed and inverted version of LCK by operation of the delay circuit 603. When LCK goes high while C is still high, D goes low and PCLK goes high. After a short delay while LCK is still high, C goes low which causes D to go high and PCLK to go back low. When LCK eventually goes back low, C goes back high after the short delay though the delay circuit 603 and D and PCLK do not change. In this manner, PCLK pulses high for a short period and then goes back low in response to each rising edge transition of LCK.

The latch 204 operates in the same manner as previously described with input node DHB and clock node PCLK. Logical operation is essentially identical even though PCLK pulses high only for a short period and then goes back low. When PCLK is low, latch 204 is in its isolation state so that Q is not affected by changes of DHB. When PCLK pulses high, latch 204 is switched momentarily to its transparency state so that QB takes the same state as DHB. PCLK then goes back low so that latch 204 goes back to isolation mode. The delay circuit 603 may be implemented in any suitable fashion. In the illustrated embodiment, the delay circuit 603 includes three inverters A1, A2 and A3 coupled in series in which A1 inputs LCK and outputs A, A2 inputs A and outputs B, and A3 inputs B and outputs C. Three capacitors CA, CB and CC are coupled between the output of a respective one of the inverters A1-A3 and VSS for additional delay.

Figure 7:
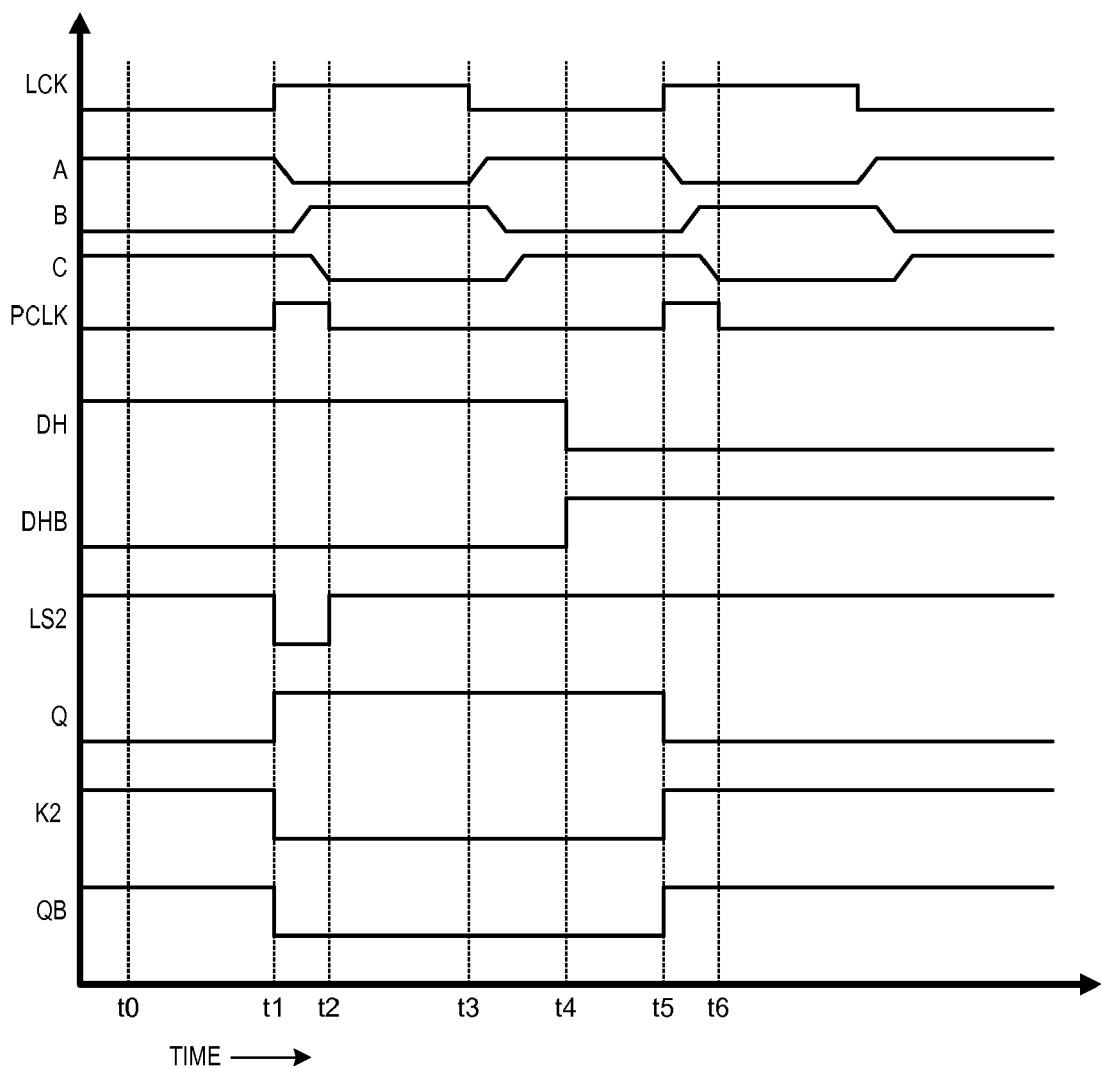
FIG. 7 is a timing diagram illustrating operation of the register circuit of FIG. 6.

FIG. 7 is a timing diagram illustrating operation of the register circuit 600. The nodes LCK, A, B, C, PCLK, DH, DHB, LS2, Q, K2 and QB are plotted versus time. Again, negligible delays through the devices are not shown other than the delays through the devices of the delay circuit 603. Also, indeterminate states are not illustrated. At initial time t0, LCK is low, PCLK is low, DH is high, DHB is low, LS2 is high, Q is low, K2 and QB are both high. The latch 204 is in isolation mode. Since PCLK is low, Q is isolated from DHB and the keeper circuit 210 is active to maintain the state of Q and QB. In particular, LS2 and K2 are both high turning on N9 and N10, respectively, which keeps Q low. At subsequent time t1, LCK goes high. Since LCK and C are both high, and ignoring negligible delays through NAND gate 605 and inverter 607, PCLK goes high at time t1 so that the latch 204 transitions to transparency mode. Since DHB is low, N8 remains off, P8 remains on, and N6 turns on so that node DHB pulls LS2 low turning on P7 and turning off N9. P7 and P8 are both on so that Q is pulled high to VDDH, and the inverters 209 and 211 pull K2 and QB, respectively, low.

A falls with slight delay, B rises with another slight delay, and C falls with a little more delay. When C finally goes low after the short delay through the delay circuit 603, PCLK is pulled back low at about time t2 transitioning the latch 204 back into isolation mode. Q is isolated from DHB, and P6 turns on and pulls LS2 back high. Since K2 and PCLK are both low turning on P9 and P10, respectively, the keeper circuit 210 keeps Q high. LCK goes back low at subsequent time t3. Although A goes high, B goes low, and C goes back high, PCLK remains low so that the state of the latch 204 does not change.

At subsequent time t4, DH goes low and DHB is pulled high. Since PCLK is low, Q remains isolated from the state change of DHB. P8 is turned off and N8 is turned on. When LCK goes high at time t5, PCLK pulses high once again N7 turns on and Q is pulled low via N7 and N8. K2 and QB are pulled high. N6 remains off and LS2 remains pulled high via P6. As previously described, when VDDL approaches or equals VDDH, P6 is also off so that LS2 has an indeterminate state while PCLK is high. In that case, P8 is turned fully off so that the state of P7 is inconsequential, and P10 is turned fully off so that the keeper circuit 210 does not content with N7 and N8 pulling Q low. When PCLK goes back low at time t6 after the delay through the delay circuit 603, P6 is turned at least partially on so that LS2 is pulled high to VDDH, which turns on N9. K2 and LS2 are both high after time t6 to keep Q pulled low during the isolation state of the latch 204.

Figure 8:
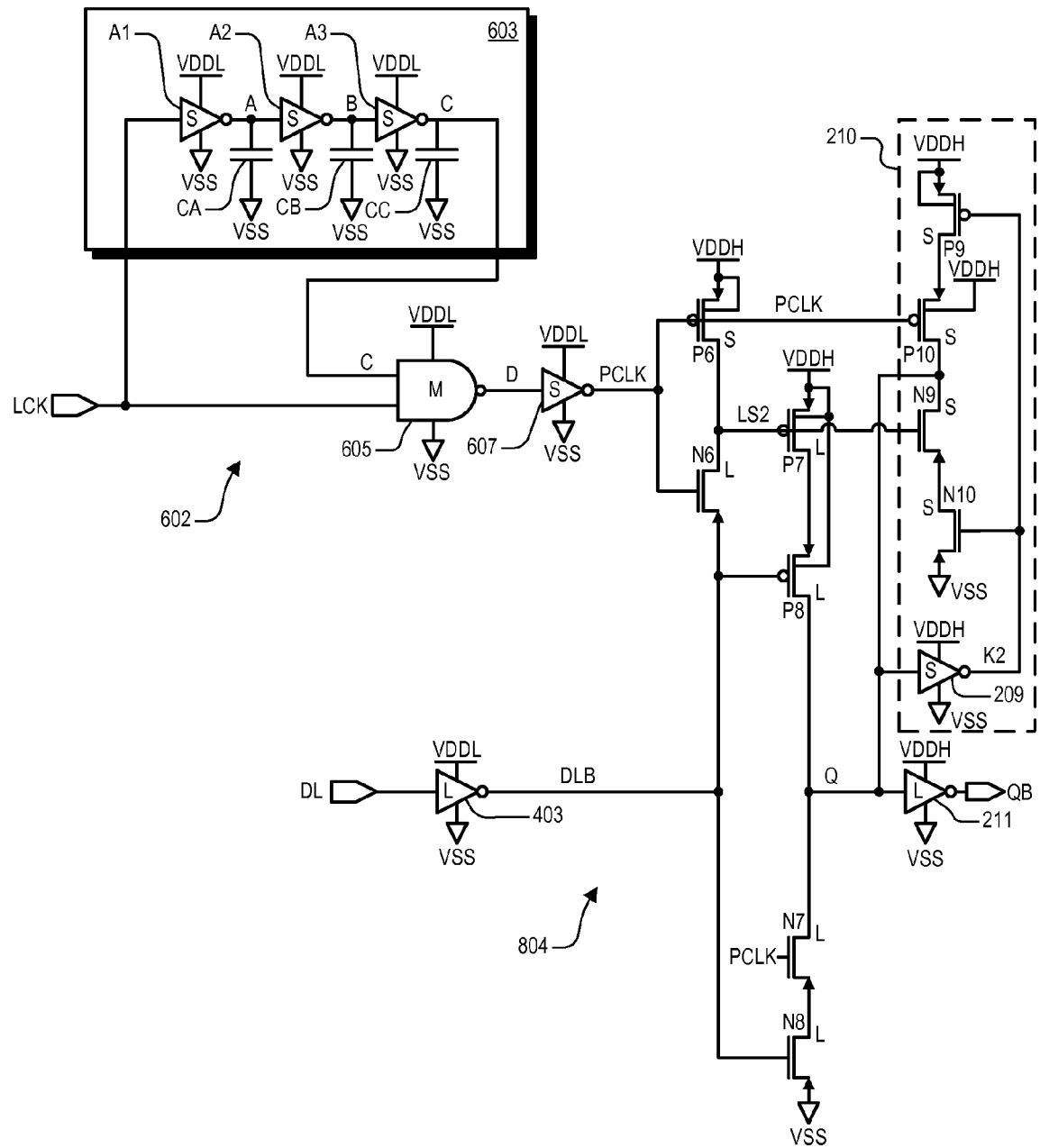
FIG. 8 is a schematic diagram of a pulsed-clock register circuit implemented according to an exemplary embodiment of one or more of the register circuits of FIG. 1 for registering lower voltage data using a lower voltage clock.

FIG. 8 is a schematic diagram of a pulsed-clock register circuit 800 implemented according to an exemplary embodiment of one or more of the register circuits 119 of FIG. 1 for registering the lower voltage data DL of the microprocessor 105 using the LCK clock. Similar devices assume identical reference numbers. The register circuit 800 is substantially the same as the register circuit 600 except that the latch 204 is replaced by a latch 804. Latch 804 is substantially the same as the latch 204 except that the inverter 203 is replaced by the inverter 403. The inverter 403 is sourced between VDDL and VSS, receives DL at its input, and outputs the DHB signal on node DHB. Logical operation of the register circuit 800 is substantially similar as the register circuit 600. As previously described above with respect to the latch 402 receiving the lower voltage input data DLB, the latch 804 operates the same way for switching based on the lower voltage data DLB.

Figure 9:
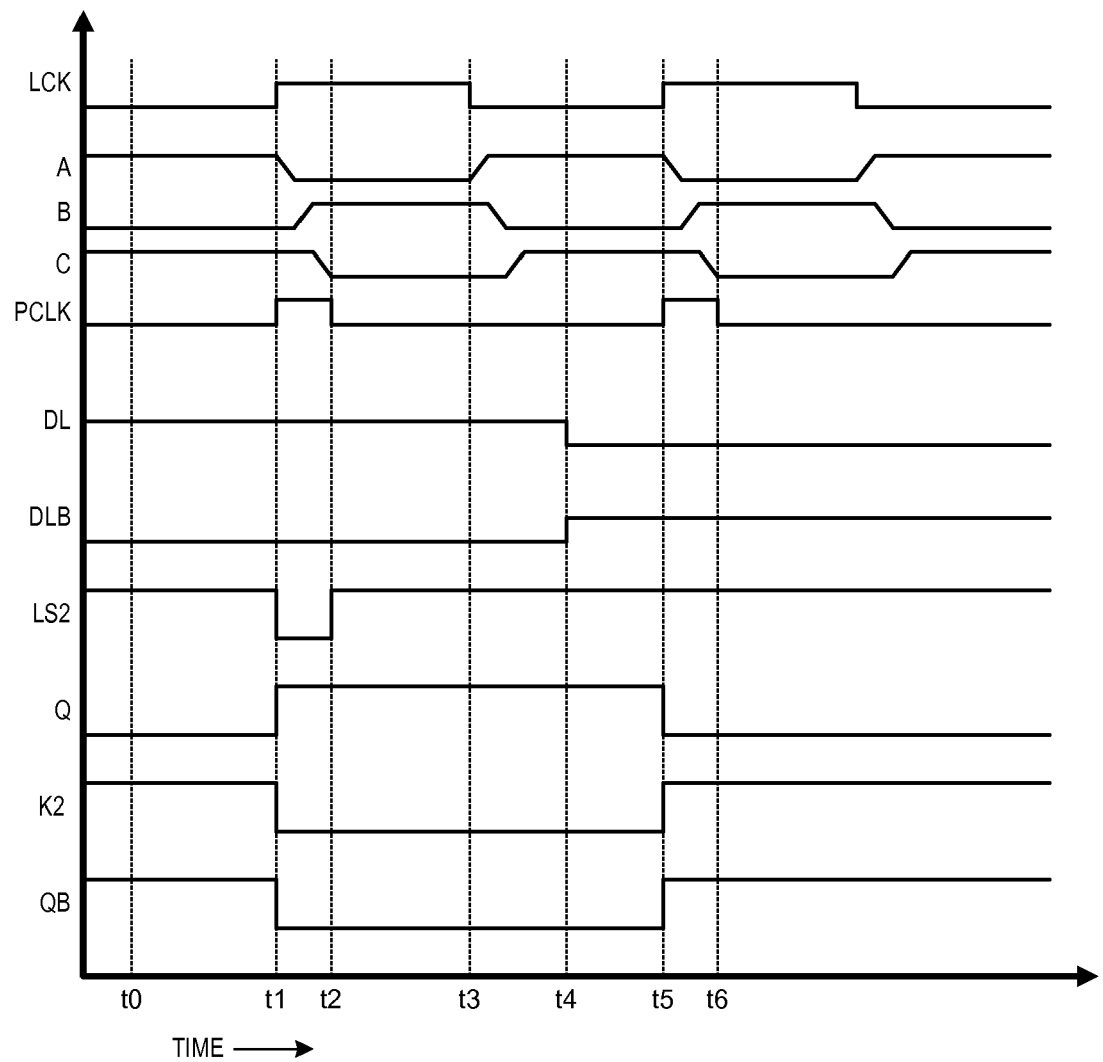
FIG. 9 is a timing diagram illustrating operation of the register circuit of FIG. 8.

FIG. 9 is a timing diagram illustrating operation of the register circuit 800 in which LCK, A, B, C, PCLK, DL, DLB, LS2, Q, K2 and QB are plotted versus time. The timing diagram of FIG. 9 is substantially similar to the timing diagram of FIG. 7 except that the DL and DLB are shown switching within the lower voltage level VSS-VDDL.

Although the present invention has been described in considerable detail with reference to certain preferred versions thereof, other versions and variations are possible and contemplated. For example, the circuits described herein may be implemented in any suitable manner including logic devices or circuitry or the like. Any number of the functions described for the logic circuits may be implemented in software or firmware within an integrated device. Those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. A register circuit, comprising:
   a first level shift circuit which switches a first level shift node between a reference voltage level and an upper voltage level in response to a first clock node and a first input node;
   wherein said first clock node toggles between said reference voltage level and a lower voltage level, wherein said lower voltage level and said upper voltage level are both greater than said reference voltage level, and wherein said upper voltage level is greater than said lower voltage level;
   a first latch isolation circuit which isolates a first output node from said first input node when said first clock node is at said reference voltage level, and which asserts said first output node to one of said reference voltage level and said upper voltage level based on a state of said first input node when said first clock node is at said lower voltage level; and
   a first keeper circuit which maintains a state of said first output node when said first clock node is at said reference voltage level.

2. The register circuit of claim 1, wherein said first level shift circuit comprises:
   a P-channel device having a gate coupled to said first clock node, having a drain coupled to said first level shift node, and having a source and bulk coupled to a first source voltage node at said upper voltage level; and
   an N-channel device having a source coupled to said first input node, having a bulk coupled to a second source voltage node at said reference voltage level, having a drain coupled to said first level shift node, and having a gate coupled to said first clock node.

3. The register circuit of claim 2, wherein said first latch isolation circuit comprises:
   a second P-channel device having a gate coupled to said first level shift node, having a drain, and having a source and bulk coupled to said first source voltage node;
   a third P-channel device having a gate coupled to said first input node, having a drain coupled to said first output node, having a source coupled to said drain of said second P-channel device, and having a bulk coupled to said first source voltage node;
   a second N-channel device having a drain coupled to said first output node, having a bulk coupled to said second source voltage node, having a source, and having a gate coupled to said first clock node; and
   a third N-channel device having a drain coupled to said source of said second N-channel device, having a bulk and source coupled to said second source voltage node, and having a gate coupled to said first input node.

4. The register circuit of claim 1, wherein said first latch isolation circuit comprises:
   a first P-channel device having a gate coupled to said first level shift node, having a drain, and having a source and bulk coupled to a first source voltage node at said upper voltage level;
   a second P-channel device having a gate coupled to said first input node, having a drain coupled to said first output node, having a source coupled to said drain of said first P-channel device, and having a bulk coupled to said a first source voltage node;
   a first N-channel device having a drain coupled to said first output node, having a bulk coupled to a second source voltage node at said reference voltage level, having a source, and having a gate coupled to said first clock node; and
   a second N-channel device having a drain coupled to said source of said first N-channel device, having a bulk and source coupled to said a second source voltage node, and having a gate coupled to said first input node.

5. The register circuit of claim 1, wherein said first keeper circuit comprises:
   a first P-channel device having a gate coupled to a keeper node, having a drain, and having a source and bulk coupled to a first source voltage node at said upper voltage level;
   a second P-channel device having a gate coupled to said first clock node, having a drain coupled to said first output node, having a source coupled to said drain of said first P-channel device, and having a bulk coupled to said first source voltage node;
   a first N-channel device having a drain coupled to said first output node, having a bulk coupled to a second source voltage node at said reference voltage level, having a source, and having a gate coupled to said first level shift node;
   a second N-channel device having a drain coupled to said source of said first N-channel device, having a bulk and source coupled to said second source voltage node, and having a gate coupled to said keeper node; and
   an inverter, sourced between said first and second source voltage nodes, having an input coupled to said first output node, and having an output coupled to said keeper node.

6. The register circuit of claim 1, further comprising:
   said level shift circuit, said first latch isolation circuit, and said first keeper circuit collectively comprising a master latch circuit; and
   a slave latch circuit, comprising:
      a second level shift circuit which switches a second level shift node between said reference voltage level and said upper voltage level in response to a second clock node and a second input node;
      a second latch isolation circuit which isolates a second output node from said second input node when said second clock node is at said reference voltage level, and which asserts said second output node to one of said reference voltage level and said upper voltage level based on a state of said second input node when said second clock node is at said lower voltage level; and
      a second keeper circuit which maintains a state of said second output node when said second clock node is at said lower voltage level;
   a first inverter, sourced between said reference voltage level and said lower voltage level, having an input coupled to said second clock node and an output coupled to said first clock node; and
   a second inverter, sourced between said reference voltage level and said upper voltage level, having an input coupled to said first output node and an output coupled to said second input node.

7. The register circuit of claim 1, further comprising:
said level shift circuit, said first latch isolation circuit, and said first keeper circuit collectively comprising a slave latch circuit; and
a pulse clock circuit, sourced between said reference voltage level and said lower voltage level, which asserts a clock pulse on said first clock node in response to a transition of a second clock node between said reference voltage level and said lower voltage level.

8. The register circuit of claim 7, wherein said pulse clock circuit comprises:
a logic AND gate circuit, sourced between said reference voltage level and said lower voltage level, having a first input coupled to said second clock node, a second input coupled to a delay node, and an output coupled to said first clock node; and
a delay circuit, sourced between said reference voltage level and said lower voltage level, which delays and inverts said delay node with respect to said second clock node.

9. An integrated circuit, comprising:
a clock circuit comprising a first clock node wherein said clock circuit toggles said first clock node between a reference voltage level and a lower voltage level;
wherein said lower voltage level and an upper voltage level are both greater than said reference voltage level and wherein said upper voltage level is greater than said lower voltage level;
a register circuit, comprising:
a first level shift circuit which switches a first level shift node between said reference voltage level and said upper voltage level in response to said first clock node and a first input node;
a first latch isolation circuit which isolates a first output node from said first input node when said first clock node is at said reference voltage level, and which asserts said first output node to one of said reference voltage level and said upper voltage level based on a state of said first input node when said first clock node is at said lower voltage level; and
a first keeper circuit which maintains a state of said first output node when said first clock node is at said reference voltage level.

10. The integrated circuit of claim 9, wherein said clock circuit reduces voltage of said first clock node from said upper voltage level to said lower voltage level during a reduced power state.

11. The integrated circuit of claim 9, wherein said clock circuit and said register circuit are integrated onto a microprocessor chip.

12. The integrated circuit of claim 11, wherein said register circuit is integrated on a higher voltage portion of said microprocessor chip.

13. The integrated circuit of claim 9, further comprising a functional circuit having an output coupled to said first input node, wherein said function circuit switches said first input node between said reference voltage level and said lower voltage level.

14. The integrated circuit of claim 9, wherein said first level shift circuit, said first latch isolation circuit, and said first keeper circuit collectively comprise a master latch circuit, and wherein said register circuit further comprises:
a slave latch circuit, comprising:
a second level shift circuit which switches a second level shift node between said reference voltage level and said upper voltage level in response to a second clock node and a second input node;
a second latch isolation circuit which isolates a second output node from said second input node when said second clock node is at said reference voltage level, and which asserts said second output node to one of said reference voltage level and said upper voltage level based on a state of said second input node when said second clock node is at said lower voltage level; and
a second keeper circuit which maintains a state of said second output node when said second clock node is at said lower voltage level;
a first inverter, sourced between said reference voltage level and said lower voltage level, having an input coupled to said second clock node and an output coupled to said first clock node; and
a second inverter, sourced between said reference voltage level and said upper voltage level, having an input coupled to said first output node and an output coupled to said second input node.

15. The integrated circuit of claim 9, further comprising:
said level shift circuit, said first latch isolation circuit, and said first keeper circuit collectively comprising a slave latch circuit; and
a pulse clock circuit, sourced between said reference voltage level and said lower voltage level, which asserts a clock pulse on said first clock node in response to a transition of a second clock node between said reference voltage level and said lower voltage level.

16. The integrated circuit of claim 9, wherein:
said first level shift circuit comprises:
a P-channel device having a gate coupled to said first clock node, having a drain coupled to said first level shift node, and having a source and bulk coupled to a first source voltage node at said upper voltage level; and
an N-channel device having a source coupled to said first input node, having a bulk coupled to second source voltage node at said reference voltage level, having a drain coupled to said first level shift node, and having a gate coupled to said first clock node; and
wherein said first latch isolation circuit comprises:
a second P-channel device having a gate coupled to said first level shift node, having a drain, and having a source and bulk coupled to said first source voltage node;
a third P-channel device having a gate coupled to said first input node, having a drain coupled to said first output node, having a source coupled to said drain of said second P-channel device, and having a bulk coupled to said first source voltage node;
a second N-channel device having a drain coupled to said first output node, having a bulk coupled to said second source voltage node, having a source, and having a gate coupled to said first clock node; and
a third N-channel device having a drain coupled to said source of said second N-channel device, having a bulk and source coupled to said second source voltage node, and having a gate coupled to said first input node.

17. A method of registering a state of an input node, comprising:
toggling a clock node between a reference voltage level and a lower voltage level, wherein the lower voltage level is greater than the reference voltage level and less than an upper voltage level;
controlling a level shift circuit to pull a level shift node to the upper voltage level when the clock node is at the reference voltage level, and to pull the level shift node to the reference voltage level when the clock node is at the lower voltage level and the data node is at the reference voltage level;

controlling a latch isolation circuit to pull an output node high to the upper voltage level when the level shift node and the input node are both at the reference voltage level, to pull the output node to the reference voltage level when the clock node is at the lower voltage level and when the input node is at least as high as the lower voltage level, and to isolate the output node from the input node when the clock node is at the reference voltage level; and controlling a keeper circuit to maintain the voltage level of the output node when the clock signal is at the lower voltage level.

18. The method of claim 17, wherein said controlling a level shift circuit comprises turning on a P-channel device which is coupled between the clock node and the level shift node.

19. The method of claim 17, wherein said controlling a level shift circuit comprises turning on an N-channel device, which is coupled between the input node and the level shift node, when the clock node is at the lower voltage level and the input node is at the reference voltage level.

20. The method of claim 17, wherein said controlling a level shift circuit further comprises turning a P-channel device, which is coupled between the clock node and the level shift node, at least partially on to pull the level shift node to the upper voltage level when the clock node is at the lower voltage level and the input node is at least at the lower voltage level.

* * * * *